United States Patent
Manz et al.

(10) Patent No.: US 7,190,070 B2
(45) Date of Patent: Mar. 13, 2007

(54) MODULAR POWER SEMICONDUCTOR MODULE

(75) Inventors: Yvone Manz, Weisenburg (DE); Markus Gruber, Berg (DE); Aseem Wahi, Nürnberg (DE)

(73) Assignee: Semikron Elektronik GmbH & Co. KG, Nürnberg (DE)

( * ) Notice: Subject to any disclaimer, the term of this patent is extended or adjusted under 35 U.S.C. 154(b) by 109 days.

(21) Appl. No.: 10/821,308

(22) Filed: Apr. 9, 2004

(65) Prior Publication Data

US 2005/0012190 A1 Jan. 20, 2005
US 2005/0093122 A9 May 5, 2005

(30) Foreign Application Priority Data

Apr. 10, 2003 (DE) .................. 103 16 356

(51) Int. Cl.
*H01L 23/34* (2006.01)
(52) U.S. Cl. .............. 257/723; 257/724; 257/728
(58) Field of Classification Search ........ 257/723–725, 257/713, 720, 717, 718, 784, E23.173, E25.016, 257/E23.084, E23.092, E23.187, 728; 663/147, 663/144; 363/131, 720, 728, 55; 361/715
See application file for complete search history.

(56) References Cited

U.S. PATENT DOCUMENTS 4,790,763 A * 12/1988 Weber et al. ............ 439/65
6,690,087 B2 * 2/2004 Kobayashi et al. ......... 257/686
6,802,745 B2 * 10/2004 Loddenkoetter ........... 439/709
6,835,994 B2 * 12/2004 Kistner et al. ............. 257/501
6,856,012 B2 * 2/2005 Kaufmann .................. 257/690
2001/0030037 A1 * 10/2001 Hellbruck et al. ......... 165/80.3
2002/0153532 A1 * 10/2002 Sonobe et al. ............. 257/150
2005/0024805 A1 * 2/2005 Heilbronner et al. ....... 361/100

FOREIGN PATENT DOCUMENTS

| DE | 39 37 045 A1 | 5/1991 |
| DE | 100 11 633 A1 | 9/2001 |
| EP | 828341 A2 * | 3/1998 |
| EP | 1263045 A1 * | 12/2002 |

* cited by examiner

*Primary Examiner*—Thao X. Le
(74) *Attorney, Agent, or Firm*—Cohen, Pontani, Lieberman & Pavane

(57) ABSTRACT

A modular power semiconductor module for mounting on a heat sink comprises a plurality of partial modules, each having a base plate and a framelike housing as well as terminal elements for load terminals and auxiliary terminals. Adjacent partial modules are assembled into a complete power semiconductor module by means of a cap that fixes the partial modules relative to one another and/or by means of connections that fix the various partial modules relative to one another.

7 Claims, 6 Drawing Sheets

MODULAR POWER SEMICONDUCTOR MODULE

BACKGROUND OF THE INVENTION

1. Field of the Invention

The invention describes a modular power semiconductor module. In principle, such power semiconductor modules comprise a housing with a base plate and at least one electrically insulated substrate disposed in it. The electrically insulated substrate in turn comprises an insulation body with a plurality of metal connection tracks located on it and insulated from one another and power semiconductor components located on the connection tracks and connected with appropriate wiring to these connection tracks. Advantageously, the substrate, on its underside, has a flat metal layer comparable to the connection tracks.

2. Description of the Related Art

In principle, power semiconductor modules of this kind, as published for instance in German Patent Disclosure DE 39 37 045 A1, have long been known. Various modern versions of such power semiconductor modules with high power for their size, which are the point of departure for this invention, are known for instance from German Patent Disclosure DE 100 11 633 A1.

DE 39 37 045 A1 for instance discloses a power semiconductor module, of the type defined above, which has a half-bridge circuit inside a housing. A circuit arrangement of this kind comprises two series-connected power switches, which are often embodied as a series circuit of power transistors, preferably insulated gate bipolar transistors (IGBTs). Free-wheeling diodes are connected antiparallel to the various power switches. The power semiconductor module furthermore has terminal elements for the direct- and alternating-current load terminals. Such power semiconductor modules also have auxiliary terminal elements for triggering the power transistors and for further functions.

Typical power semiconductor modules have a plurality of screw connections for mounting on flat bodies, which as a rule are external heat sinks. The holes for such screw connections are preferably disposed in the corner regions of the power semiconductor modules.

From DE 100 11 633 A1, a further power semiconductor module is for instance known which has three half-bridge circuits, that is, a three-phase full-bridge circuit, inside one housing. The half-bridge circuit arrangements are disposed in three regions of the housing. The various circuit arrangements here again correspond to those of the prior art described above.

A disadvantage of constructing power semiconductor modules with one half-bridge circuit per housing, as in DE 39 37 045 A1, is that when three-phase full-bridge circuits are constructed from these individual modules, each module must be secured separately to the heat sink. Thus, replacing a power semiconductor module having a three-phase full-bridge circuit, as in DE 100 11 633 A1, with the aforementioned individual modules cannot be done by a simple exchange, since the fastening connections are not identical.

On the other hand, a three-phase full-bridge circuit inside a housing proves to be disadvantageous, because flaws in one half-bridge circuit found during production are a defect of the entire module. It is also disadvantageous that for other circuit arrangements, such as an H bridge, other housings, in this case with two half-bridge circuits for instance, are required, making economical production using only a small number of component groups impossible.

SUMMARY OF THE INVENTION

The object of the present invention is to present a power semiconductor module which has a modular construction comprising a plurality of identical partial modules.

The invention is a power semiconductor module having a base plate for mounting on a flat body, preferably a heat sink, as in the prior art defined above, comprising a framelike housing with at least one electrically insulated substrate disposed in it. This substrate in turn comprises an insulation body with a plurality of metal connection tracks, located on its first main face and insulated from one another, and preferably also a flat metal layer disposed on its second main face. A plurality of power semiconductor components are disposed on the connection tracks of the first main face and are connected with appropriate wiring to these connection tracks.

The power semiconductor module of the invention comprises a plurality of partial modules of the type defined above. Each partial module has load and auxiliary terminal elements, and the load terminals are preferably each embodied as one positive, one negative, and at least one alternating-current terminal. The auxiliary terminals serve to trigger the power semiconductor components and also serve for example as control terminals, or are used for making electrical contact with sensor system components disposed in the power semiconductor module.

The partial modules are connected to make a power semiconductor module by means of fixing elements. Suitable examples of a fixing element are a cap that fits over all the partial modules and/or connections in the region of the framelike housing and/or in the region of the base plates.

Advantages of this embodiment of a power semiconductor module include that because it is divided up into partial modules, these partial modules can be exchanged individually if they are defective;

because the partial modules are identical, various power semiconductor modules can be produced with less expense for parts; and despite its being made up of individual partial modules, the power semiconductor module is compatible with the prior art, such as a three-phase full-bridge circuit.

The invention will be described in further detail in terms of exemplary embodiments in conjunction with FIGS. 1–7.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PREFERRED EMBODIMENTS

Figure 1:
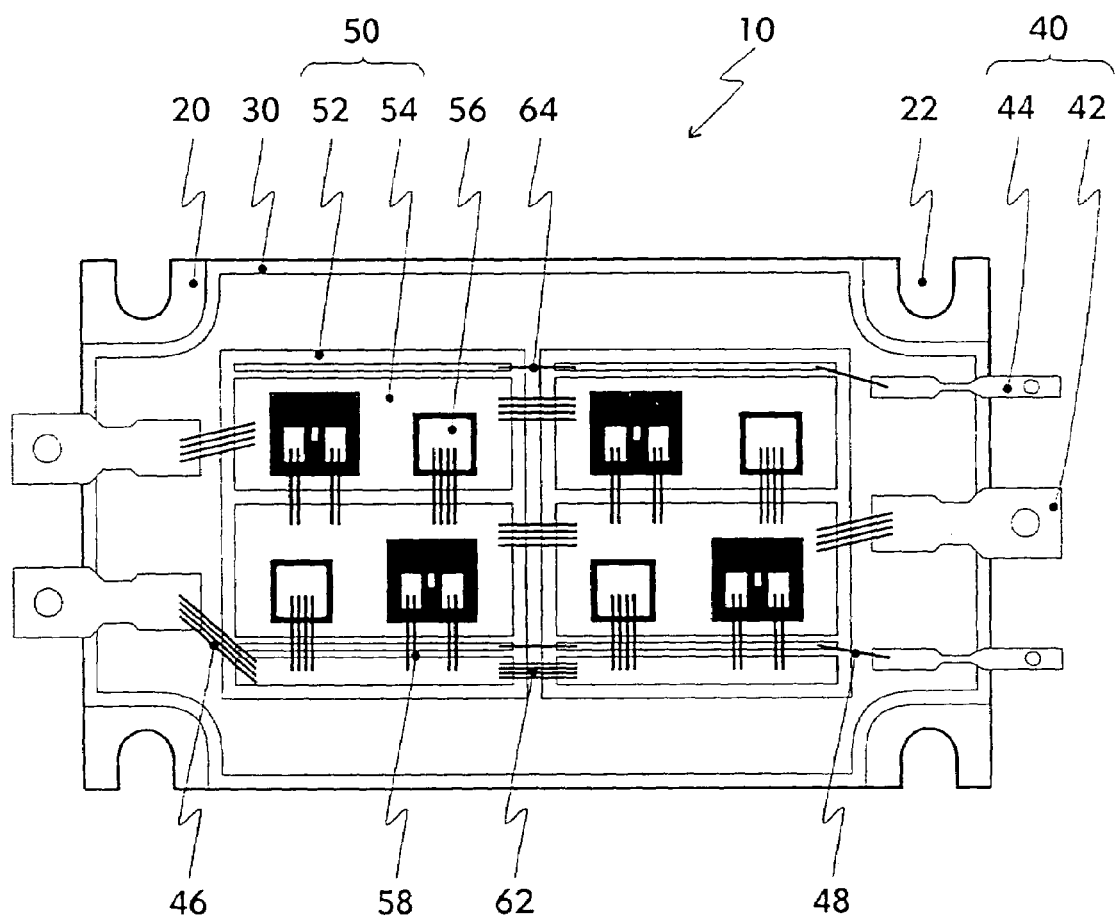
FIG. 1 shows a partial module of a power semiconductor module of the invention in plan view.

FIG. 1 is a plan view of a partial module of a power semiconductor module in accordance with the invention. A partial module 10 is shown, comprising a base plate 20, for mounting on a heat sink. For that purpose, this base plate 20 has one open oblong-slotlike recess 22 in the region of each of its corners. These recesses are disposed in the peripheral region in such a way that their openings are disposed on those sides of the base plate that are associated with a further partial module 10 of the power semiconductor module (see FIG. 2).

The partial module 10 also comprises a framelike housing 30 and two electrically insulated substrates 50. Each substrate in turn comprises a respective insulation body 52 with a plurality of metal connection tracks 54, insulated from one another and located on the first main face of the insulation body, oriented away from the base plate. On its second main face, toward the heat sink, the substrate has a flat metallization that is similar to the connection tracks on the first main face. Power semiconductor components 56 are disposed on the connection tracks 54 and connected to them with appropriate wiring by means of wire bond connections 58. For making electrical contact, the partial module 10 has terminal elements 40 for the load terminals 42 and auxiliary terminals 44. The connection tracks 54 of the substrates 50 are connected to one another and to the terminal elements 40 by means of wire bond connections 62, 64, 46, 48. Alternatively, it is understood that soldered connections are also possible.

Figure 2:
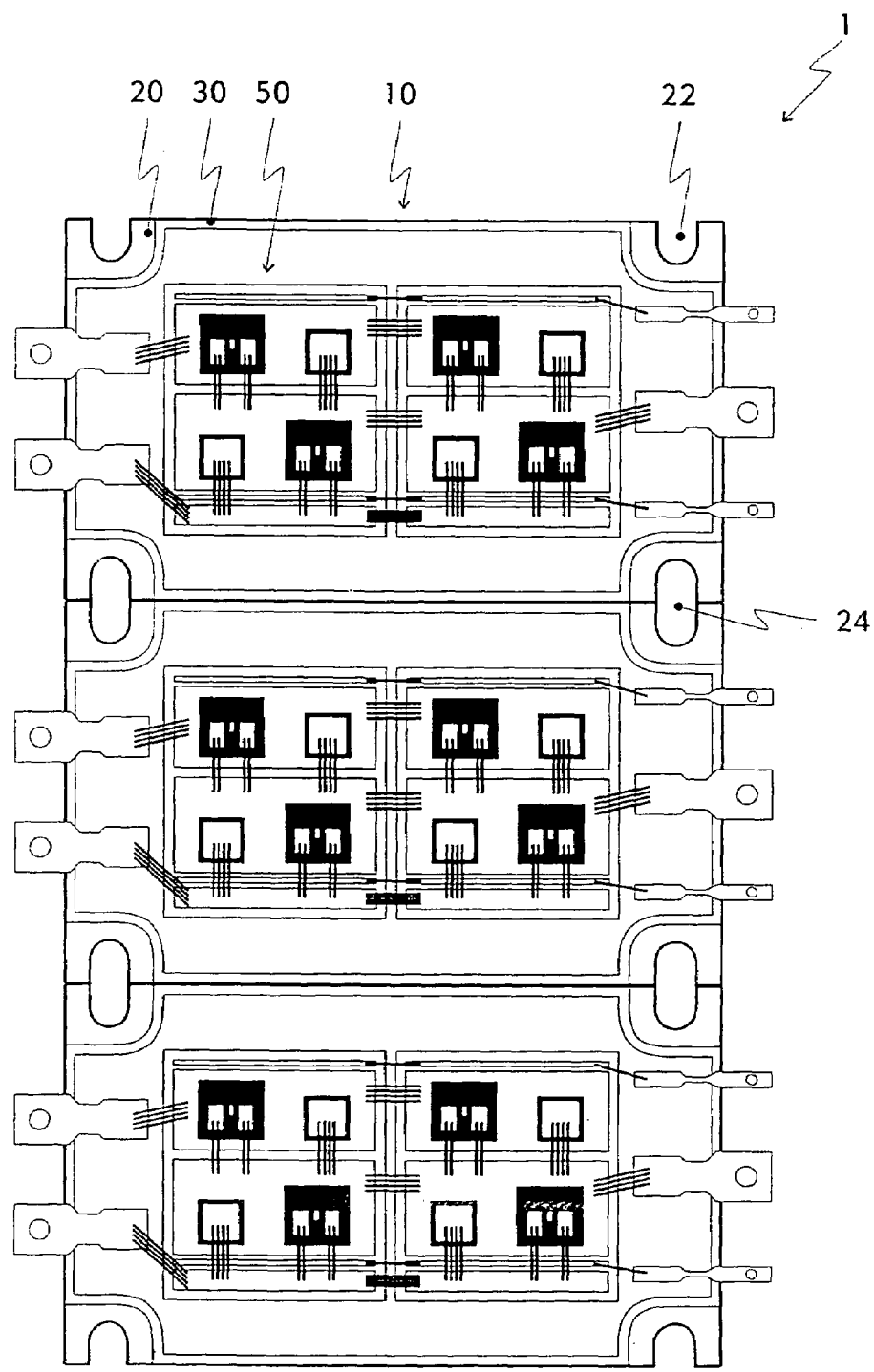
FIG. 2 shows the arrangement of three partial modules to make one power semiconductor module of the invention.

FIG. 2 in plan view shows the disposition of three partial modules 10 of FIG. 1 to make one power semiconductor module 1 of the invention. The partial modules 10 are disposed with their long sides toward one another. The result, from the open oblong-slotlike recesses 22 (FIG. 1) where the partial modules 10 contact one another, is oblong slots 24, half of each of which is formed by these respective recesses 22. These oblong slots 24, like the recesses 22 that remain on the short sides of the power semiconductor module, serve to fasten the power semiconductor module 1 to a heat sink.

Figures 3A, 3B:
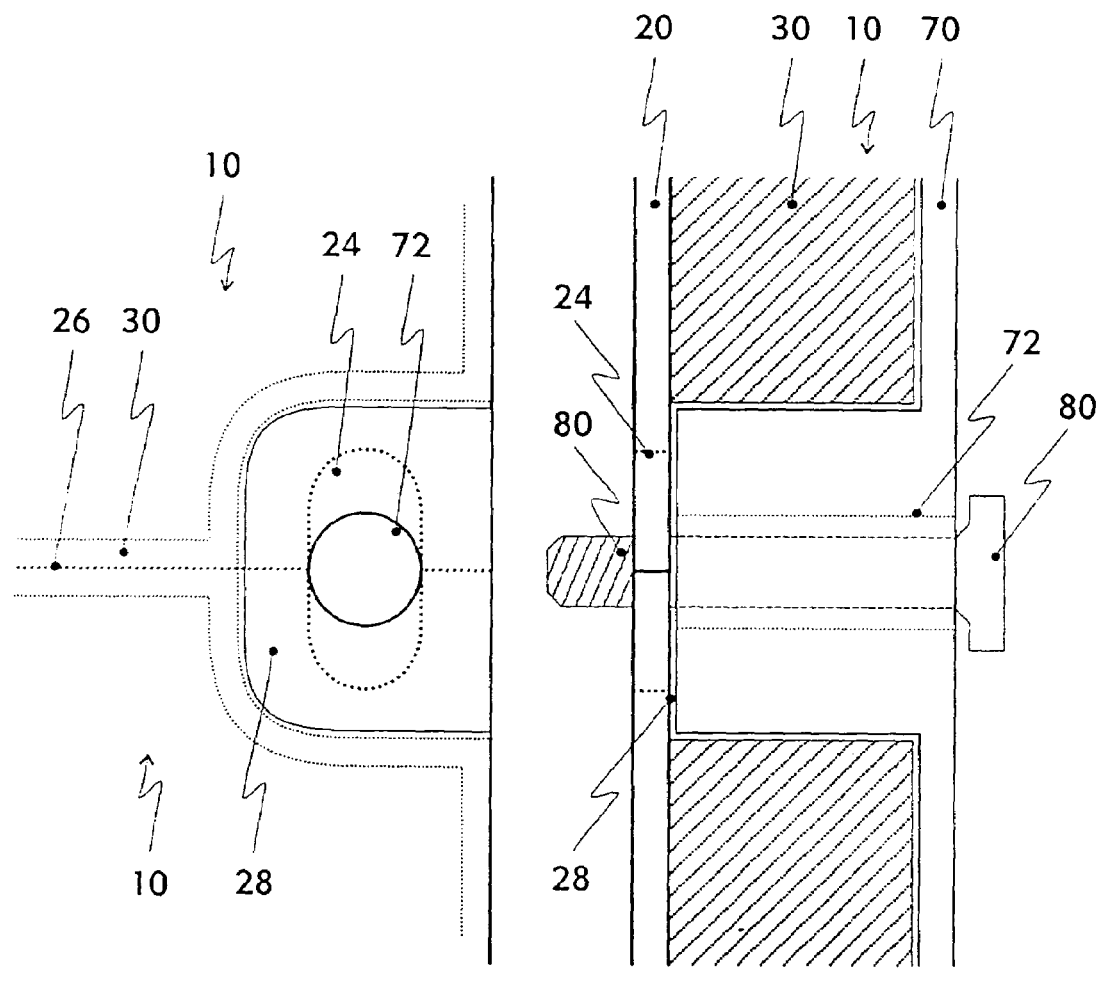
FIG. 3a is a fragmentary view of a power semiconductor module of the invention in plan view.
FIG. 3b is a fragmentary view of a power semiconductor module of the invention in a side view.

A fragmentary view of a power semiconductor module of the invention is shown in plan view in FIG. 3a and in side view in FIG. 3b. Here, the housing 30 and one of the oblong slots 24 already described in FIG. 2 are shown, forming two partial modules 10 at an abutting edge 26. A round hole 72 in a cap 70 is also shown. Cap 70 covers both partial modules 10 and by means of a screw 80 fixes the two partial modules on a heat sink. For that purpose, cap 70 has a stop face, which rests on the parts 28 of the base plate 20 where the housing 30 is recessed.

Figure 4:
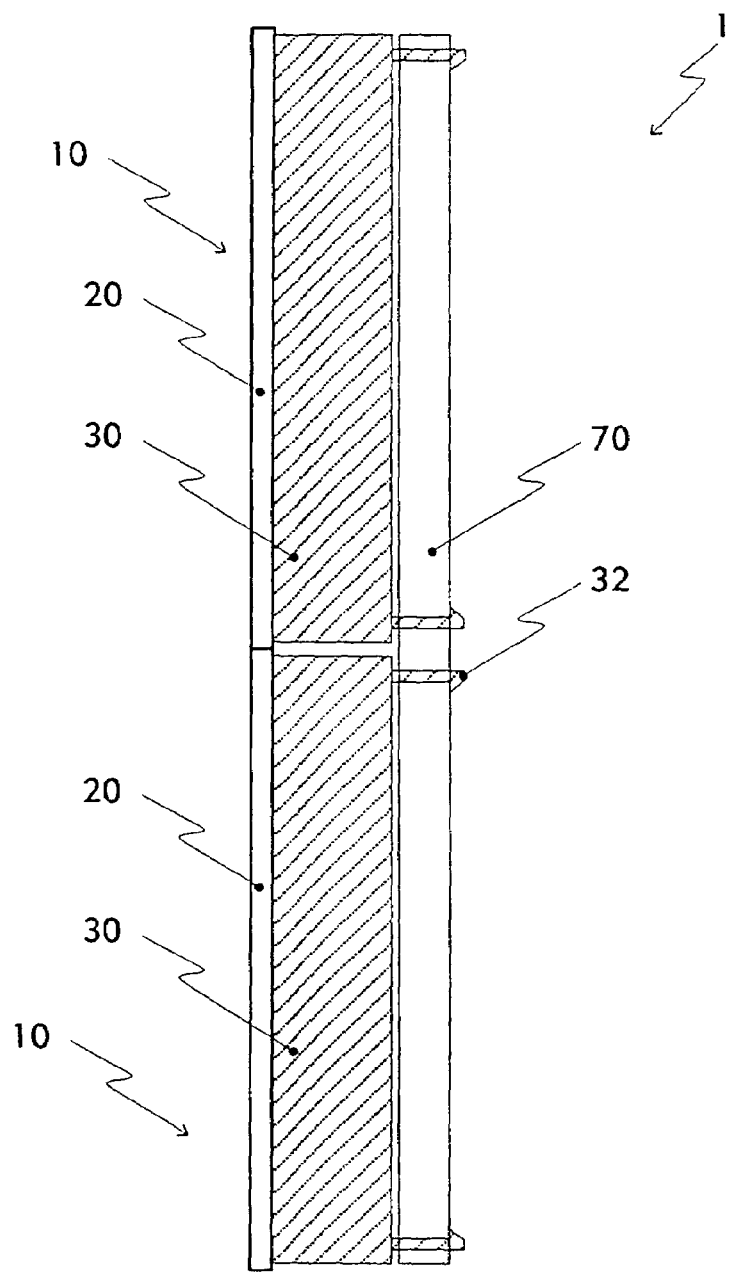
FIG. 4 shows a further embodiment of a power semiconductor module of the invention with a snap-detent connection of the cap.
Figure 4:
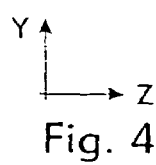

FIG. 4 shows a further embodiment of a power semiconductor module of the invention with a snap-detent connection of the cap. Each housing 30, disposed on a base plate 20 of each respective partial module 10, has a plurality of detent lugs 32. With the associated abutments of the cap 70, these detent lugs form a snap-detent connection. Thus, by mounting cap 70 to a modular power semiconductor module with partial modules fixed relative to one another is created from the individual partial modules 10.

Alternatively, it is understood that cap 70 can have the detent lugs while the housing 30 has the associated abutments.

Figure 5:
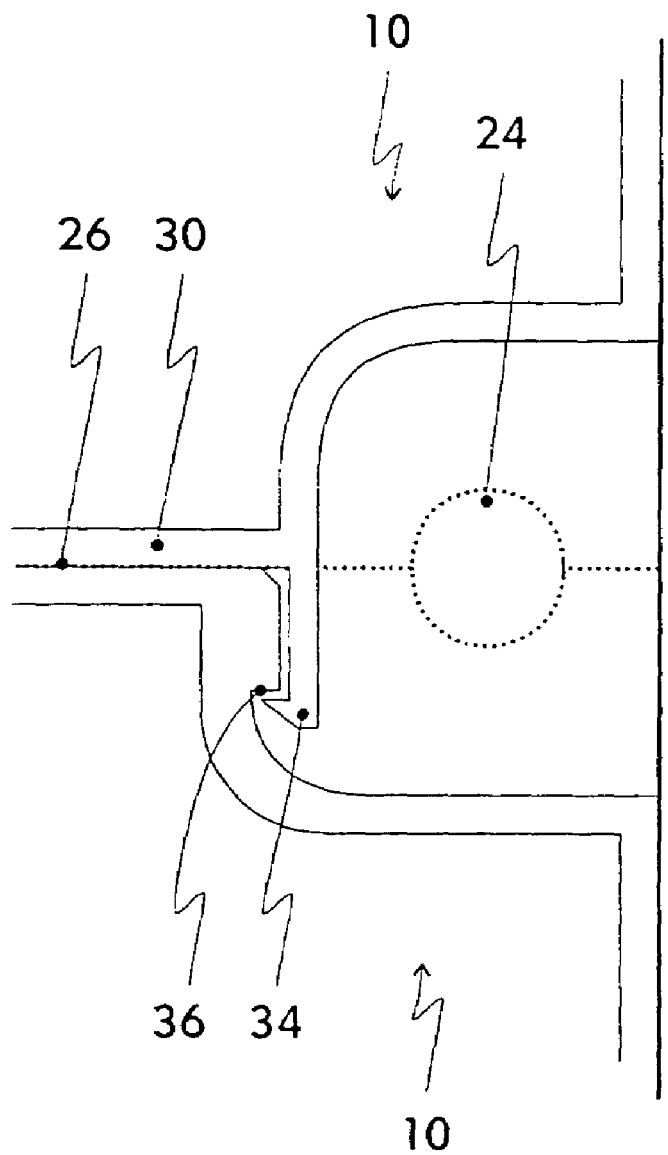
FIG. 5, in a detail, shows a further embodiment of a power semiconductor module of the invention, with snap-detent connection of the partial modules.

FIG. 5, in a detail, shows a further embodiment of a power semiconductor module of the invention, with snap-detent connection of the partial modules 10. Different variants, which can also be combined with one another, of the fixing connection of the partial modules are possible. The base plate, the housings, and/or the caps may have such fixing connections. As an example, a fixing snap-detent connection of the housings 30 is shown here. Each housing, on a side toward a further partial module, has at least one, and preferably two, detent lugs 34. The detent lug 34 of one partial housing 10 together with the abutment of the further partial housing 10 forms a fixing connection. Thus, the entire power semiconductor module is created from a plurality of individual partial modules. In this embodiment, the base plates 20 of the partial modules have half-holes 22 that face one another. Upon mounting, these form a round hole 24 for fastening the power semiconductor module to a heat sink.

An alternative way of connecting individual adjacent partial modules 10 is a preferably metal rail, disposed on the respective long sides of the power semiconductor module, which covers faces 28 (FIG. 3) where the housing is recessed and has stop faces for the purpose. This element that fixes the partial modules to make a power semiconductor module has round holes for screw connections with the heat sink. These round holes are disposed in alignment with preferably all the recesses 22 as well as the round or oblong slots 24 formed from them on the respective side.

Figure 6:
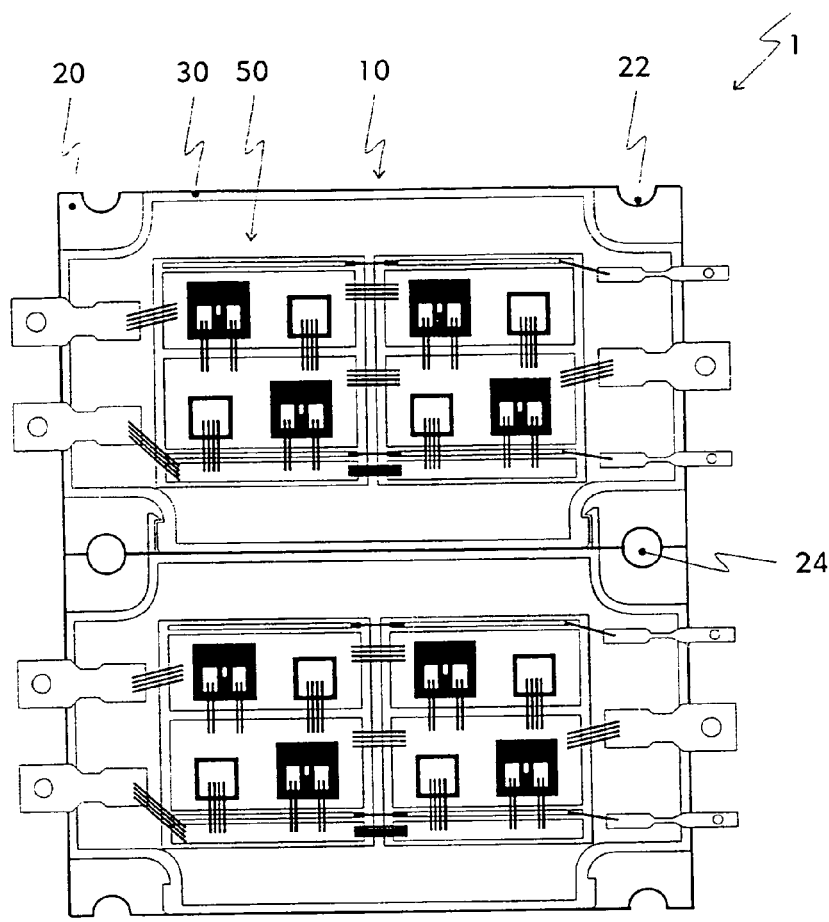
FIG. 6 shows a power semiconductor module of the invention with a connection of the partial modules as in FIG. 5.

FIG. 6 in plan view shows a power semiconductor module of the invention with a fixing connection of the two partial modules as in FIG. 5. The two round holes 24 and the half-holes 22 serve the purpose of fastening on a heat sink (see FIG. 7). This power module has one cap (not shown) for each partial module, because here the fixing connection is already provided by the snap-detent connection of the housings 30.

Figure 7:
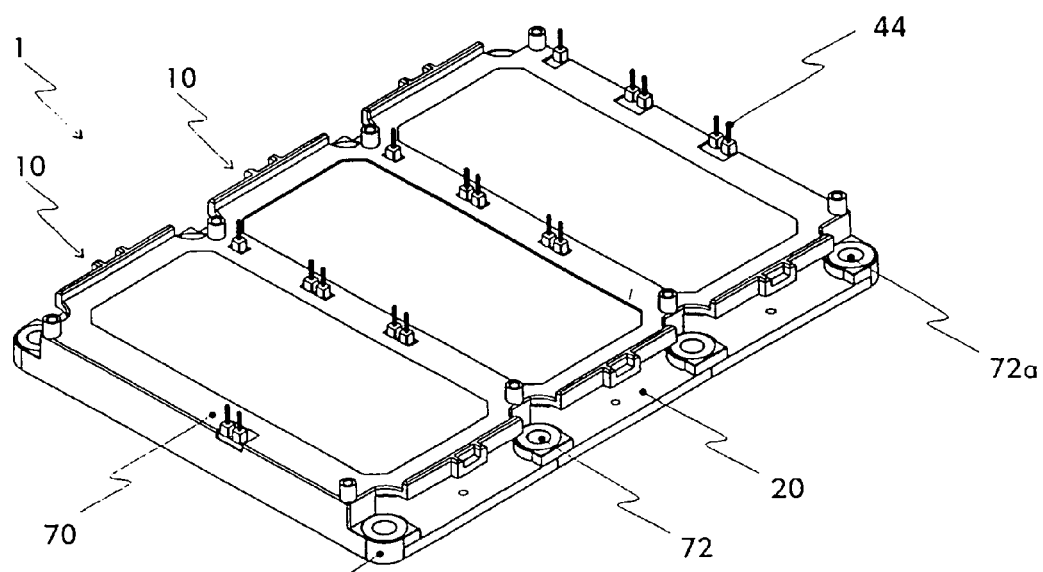
FIG. 7 shows a power semiconductor module of the invention with a cap that overlaps three partial modules.

FIG. 7 shows a power semiconductor module 1 of the invention with a cap 70 that overlaps the three partial modules 10. Cap 70, on its respective corners, has extensions 74 that protrude past the base plate and are extended as far as the heat sink, in order to assure a secure screw connection through round holes 72a of cap 70 and half-holes 22 (see FIG. 6) to a heat sink.

In this embodiment of the power semiconductor module 1, the auxiliary terminals 44 are disposed not on the short sides of the partial modules 10, but along the long sides thereof.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module for mounting on a flat body, comprising a plurality of partial modules, each of said partial modules having:
    a base plate;
    a framelike housing;
    terminal elements for load terminals and auxiliary terminals;
    at least one electrically insulated substrate disposed inside said housing on said base plate, said substrate having an insulation body with a plurality of metal connection tracks located therein and insulated from one another, and power semiconductor components, located on said connection tracks and electrically connected thereto;
    at least two open-slotlike recesses on a side thereof, and positioned so that, when said partial modules are assembled into a power semiconductor module, said recesses in sides of adjacent partial modules face one another to form closed slots; and
    a cap for connecting adjacent partial modules to one another;
    said cap having round slotlike recesses for receiving screws, which, in the abutting region of said partial modules, are aligned with said recesses that form said slots therein.

2. The power semiconductor module of claim 1, wherein said cap is connected to said partial modules by means of snap-detent connections, said housing has detent lugs, and said cap has abutments formed to cooperate with said detent lugs.

3. The power semiconductor module of claim 1, wherein each of said partial modules has, on a first side adjacent to another partial module, at least one detent lug, and on a second, opposite, side thereof has at least one abutment adapted to cooperate with a detent lug in an adjacent partial module.

4. The power semiconductor module of claim 1, wherein said means for connecting comprises fixing connections.

5. The power semiconductor module of claim 4, wherein said fixing connections include a snap-detent connection for connection of a first partial module to an adjacent partial module.

6. The power semiconductor module of claim 5, wherein each of said partial modules has at least two open-slotlike recesses on a side thereof, and positioned so that, when said partial modules are assembled into a power semiconductor module, said recesses in said sides of adjoining partial modules face one another to form closed slots.

7. The power semiconductor module of claim 4, wherein said fixing connections include a rail that covers all said recesses and said slots formed thereby in adjacent partial modules.

* * * * *